United States Patent
Hill

(10) Patent No.: US 7,230,981 B2
(45) Date of Patent: Jun. 12, 2007

(54) INTEGRATED DATA JITTER GENERATOR FOR THE TESTING OF HIGH-SPEED SERIAL INTERFACES

(75) Inventor: John P. Hill, Nederland, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 775 days.

(21) Appl. No.: 10/435,405

(22) Filed: May 9, 2003

(65) Prior Publication Data

US 2004/0223559 A1  Nov. 11, 2004

(51) Int. Cl.
*H04B 3/46* (2006.01)

(52) U.S. Cl. .................. 375/226; 375/227; 370/516; 332/124; 332/161

(58) Field of Classification Search ............... 375/224, 375/226, 227, 295, 354, 371, 373, 375, 376; 370/503, 516; 332/123, 124, 126, 127, 159–161
See application file for complete search history.

(56) References Cited

U.S. PATENT DOCUMENTS

| | | | |
|---|---|---|---|
| 5,008,865 A | | 4/1991 | Shaffer et al. |
| 5,453,993 A | * | 9/1995 | Kitaguchi et al. .......... 714/733 |
| 5,535,432 A | | 7/1996 | Dent |
| 5,923,287 A | | 7/1999 | Lennen |
| 6,343,364 B1 | | 1/2002 | Leydier et al. |
| 6,369,643 B1 | * | 4/2002 | Lee et al. .................. 327/544 |
| 6,466,387 B1 | | 10/2002 | Ogasawara et al. |
| 6,885,209 B2 | * | 4/2005 | Mak et al. .................. 324/763 |
| 2002/0103618 A1 | | 8/2002 | Schleifer et al. |
| 2002/0181608 A1 | * | 12/2002 | Kim et al. |
| 2005/0031029 A1 | * | 2/2005 | Yamaguchi et al. |

\* cited by examiner

*Primary Examiner*—Dac V. Ha
(74) *Attorney, Agent, or Firm*—Lisa K. Jorgenson; William J. Kubida

(57) ABSTRACT

An integrated data jitter generator for the testing of high speed serial interfaces is provided. A transmit timing generator for use in a transmit data path includes a high frequency clock generator such as a phase-locked loop or a delay-locked loop having an input for receiving an oscillator or reference clock input. A clock modulator receives both an existing low frequency modulation signal and a high frequency modulation signal. A high-speed modulated clock signal is generated to enable jitter testing by a downstream-coupled receiver. Fixed frequencies such as 3, 6, 125, 150, 250, 300, 750, or 1500 MHz are used for the high-speed modulation signal, but any high-speed modulation frequency can be used to generate the desired amount of jitter. Likewise, the amplitude of the high frequency modulation signal can also be varied as desired.

33 Claims, 4 Drawing Sheets

INTEGRATED DATA JITTER GENERATOR FOR THE TESTING OF HIGH-SPEED SERIAL INTERFACES

BACKGROUND OF THE INVENTION

This invention pertains to high-speed serial interfaces, and, more particularly, to an apparatus and method for injecting controlled amounts and frequencies of timing jitter into the transmit data path of a serial data interface to allow for the convenient testing of jitter tolerance.

In serial interfaces, several parameters of the transmitter and receiver influence the capability of the serial data link to provide data with a very low number of errors over time. This description of the number of errors per number of data bits transferred is known as the "BER" or Bit Error Rate. One of these parameters is known as "receiver jitter tolerance". In high-speed electronic data systems, the parameter "jitter" or "timing jitter" refers to errors in the placement of a data or clock edge compared to its ideal location. The error can be random in nature or deterministic (having a bounded amplitude). The type of jitter depends on the sources of the jitter in the electronic system. Electronic thermal noise, circuit timing dependence on supply voltage noise, and electromagnetic coupling are some of the sources of this jitter. In general, a system will have a mixture of jitter components in its signals. The receiver jitter tolerance parameter describes how well a receiver can extract data with a low error rate from a digital data stream containing jitter.

Measuring the receiver jitter tolerance has been one of the more demanding measurements due to the equipment required to produce a data stream with known amounts and frequencies of jitter. The equipment needed to generate this jittered data must have higher performance capability than the data link being tested. The BAUD rate or frequency of the data being transferred is increasing rapidly over time to provide faster data operations. The evolution of serial data interfaces in computers is an example of this trend. This increase in operating speed requires higher performance, more advanced equipment to perform these tests. The equipment currently available for such testing is quite expensive and the availability sometimes lags the need for testing the data link. It is also desirable to test the receiver jitter tolerance when the high-speed serial interface is connected into an actual system such as computer or other data equipment. This is difficult to accomplish and prone to errors when using the present jittered data generation equipment such as serial data pattern generators.

Present transmitters for high-speed serial data interfaces do not have the means for providing known amounts and frequencies of jitter for receiver jitter tolerance testing. Some transmitters, such as those with SATA (Serial ATA, wherein "ATA" stands for Advanced Technology Attachment) interfaces have the means for modulating the transmit data stream with a 30 KHz 0% to −0.5% modulation, as is called out in the SATA specification for SSC (Spread Spectrum Clocking) transmission.

Referring now to FIG. 1, a block diagram of a prior art transmission path 10 is shown. An initial timing reference or Base Frequency Clock signal 14 is provided by an internal oscillator 12. The frequency of the clock signal 14 is determined by either a quartz crystal or ceramic resonator or alternately sourced by a reference clock available from the system. This base frequency clock signal 14 is increased in frequency consistent with the data transmission rate of the serial interface in the transmit timing generator 16. In the case of SSC transmission, clock signal 18 is additionally modulated typically at 30 KHz in the transmit timing generation block 16 in order to frequency modulate the data stream to help reduce EMI emissions. This modulated high frequency clock signal 18 is the timing source for the serializer block 13 that converts the parallel data stream 11 into a serial data stream 15 at the data rate determined by clock signal 18. This Serial Transmit Data signal 15 is buffered by a transmit buffer block 17 that provides the specific amplitude and output impedance as is required by a particular interface. In high-speed serial interfaces such as SATA interfaces, the final output signal 19 is differential.

Referring now to FIG. 2, a more detailed block diagram shows a possible prior art implementation 20 of the transmit timing generation block 16 shown in FIG. 1. The clock signal input 22 is input into a high frequency clock generator 24. The output 26 of the clock generator 24 is input into a clock modulator block 28, which provides the modulated clock output signal 23. A modulator command block 27 such as an SSC modulation command provides an output 25 coupled to the clock modulator block 28.

Referring now to FIG. 3, another prior art embodiment 30 of the transmit timing generator 16 of FIG. 1 is shown. Timing generator 30 includes a DLL (Delay Locked Loop) 34 for increasing the frequency of the base frequency clock signal 32 to a frequency consistent with the desired data rate. A clock modulator circuit 38, commanded by a modulation command block 37 modulates the clock signal 36 from the DLL at a 30 KHz rate to provide the SSC modulated high frequency clock output signal 33.

Referring now to FIG. 4, the detailed block diagram shows yet another prior art embodiment 40 of the transmit timing generation block 16 shown in FIG. 1. The detailed block diagram of FIG. 4 shows a similar topology except that the initial frequency multiplication provided by the DLL 34 previously shown in FIG. 3 is now provided by a PLL (Phase Locked Loop) 44.

Referring now to FIG. 5, the detailed block diagram shows an alternative prior art embodiment for the transmit timing generation block 16 shown in FIG. 1. Timing generation block 50 contains a modulated PLL 54 that provides both the frequency multiplication as well as the SSC modulation via modulation command block 58. Typically this can be accomplished by incorporating time varying modifications to the feedback path of the PLL 54.

Referring now to FIG. 6, the detailed block diagram shows yet another prior art alternative embodiment for the transmit timing generation block 16 shown in FIG. 1. Timing generation block 60 contains a modulated DLL 64 that provides both the frequency multiplication as well as the SSC modulation via modulation command block 68. Typically this can be accomplished by incorporating time varying modifications to the delay paths in the DLL 64 structure.

None of the prior art transmit timing generation blocks shown in FIGS. 1–6 has the ability to provide the high-speed jitter testing required by high-speed serial interfaces. Present test equipment for providing the function is extremely expensive, can be hard to obtain, and is difficult to use within operating systems. Lower cost solutions exist although the general prior art method of disturbing the data stream and using the coupled receiver to function as a limiting amplifier that is error prone requires an iterative adjustment and measuring process to get the level desired.

What is desired, therefore, is a method and apparatus for providing convenient high-speed jitter testing that does not have the performance limitations of the lower-cost prior art solutions or the expense and limitations of existing test equipment.

SUMMARY OF THE INVENTION

According to the present invention, a convenient jitter testing ability is provided by adding a high-speed modulation command in the transmitter data path of a serial interface. The added high-speed modulation command has a minimal cost impact and provides margin testing within a total functioning system. The inclusion of the high-speed modulation command to provide a modulated clock signal in the transmit path solves the problems associated with present testing methods.

Jitter is injected at known sinusoidal frequencies and magnitudes that are completely variable and have a wide adjustment range. This versatile capability of the present invention is traded off with the complexity and capability of the existing transmit timing generator block. Although the high speed modulation can be provided at fixed frequencies such as 3, 6, 125, 150, 250, 300, 750, and 1500 MHz, it is desirable to be able to vary the magnitude and frequency of the high speed modulation signal to get the desired amount of jitter in the system (including the effects of cabling and connectors) and to determine the level of receiver jitter tolerance margin.

The foregoing and other objects, features and advantages of the invention will become more readily apparent from the following detailed description of a preferred embodiment of the invention, which proceeds with reference to the accompanying drawings.

DETAILED DESCRIPTION

Figure 2:
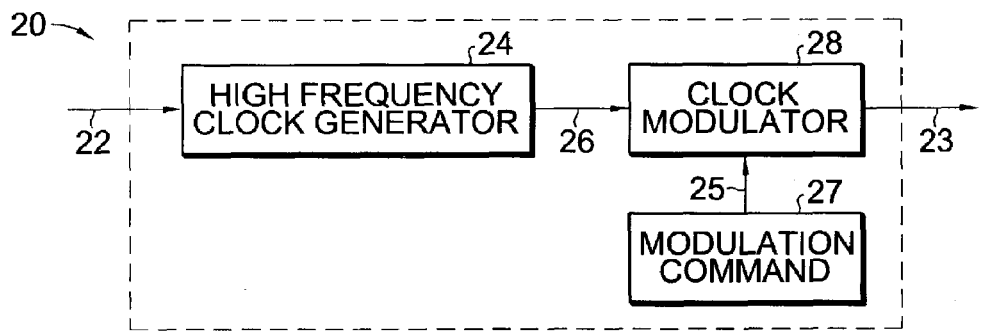
FIGS. 2–6 are block diagrams showing further details of alternative prior art embodiments for the transmit timing generator shown in FIG. 1.
Figure 3:
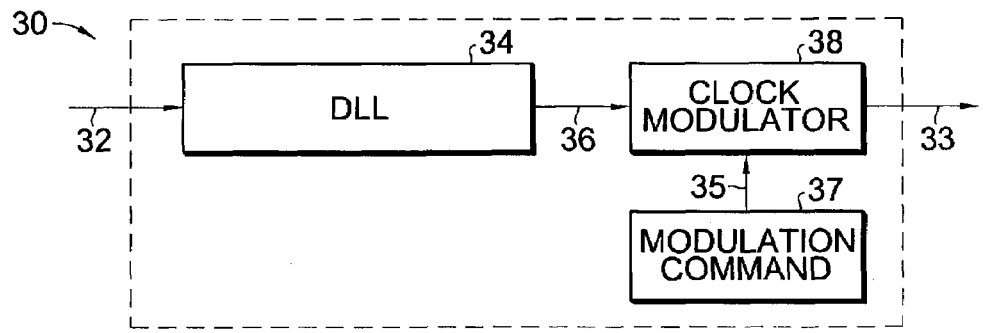
Figure 4:
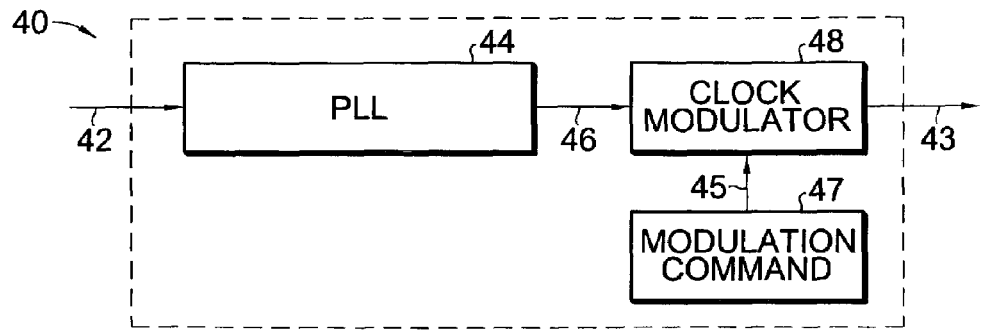
Figure 5:
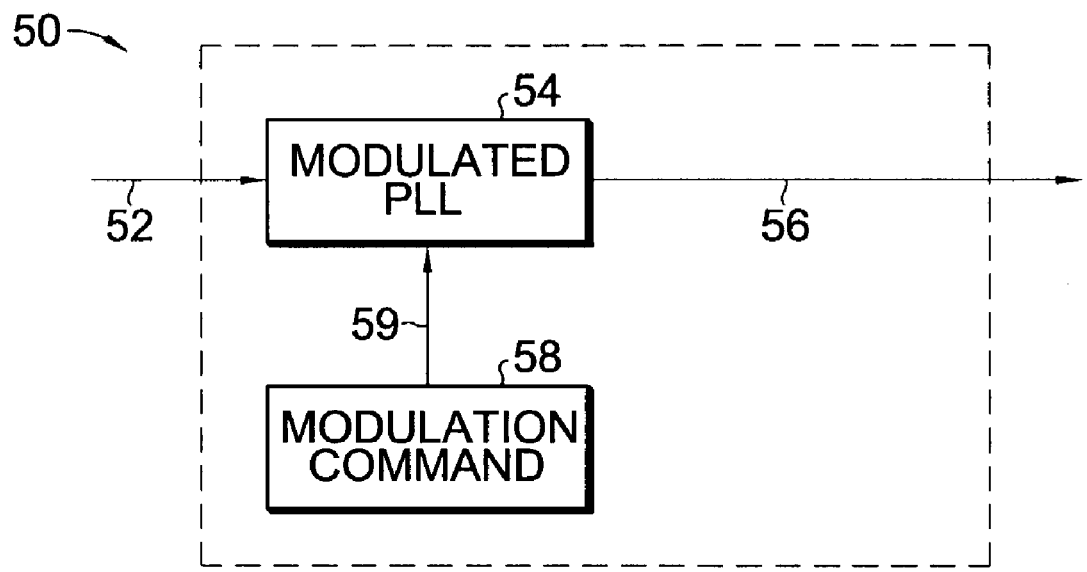
Figure 6:
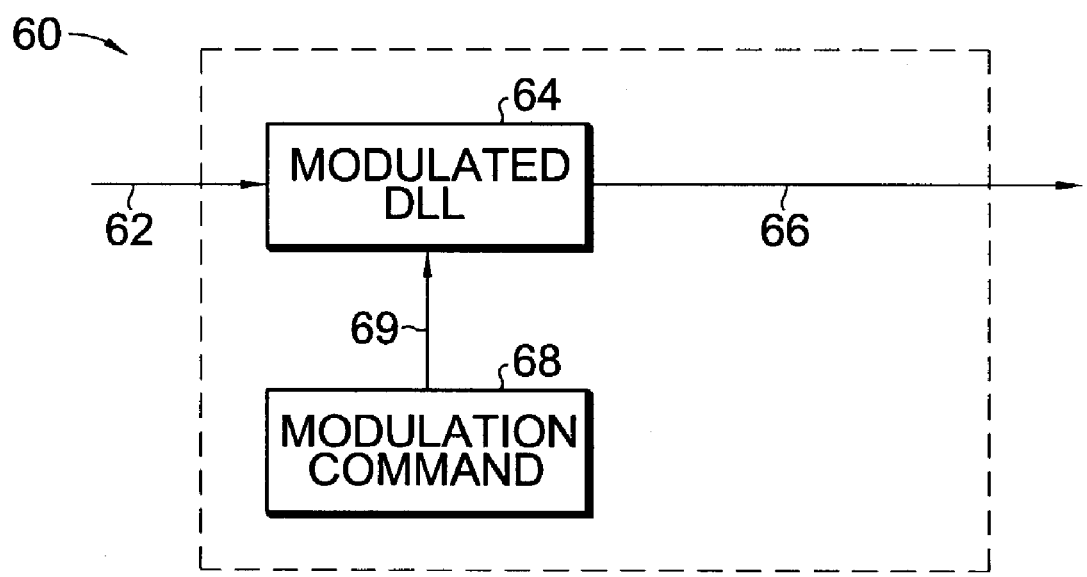
Figure 7:
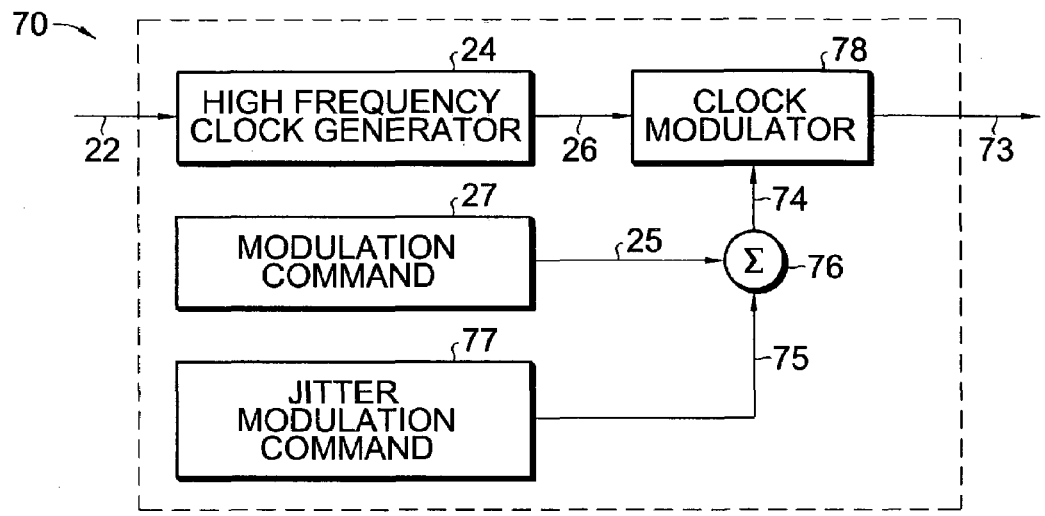
FIGS. 7–11 are block diagrams showing further details of alternative embodiments modified to enable jitter testing according to the present invention for the transmit timing generator shown in FIG. 1.

Referring now to FIG. 7, a transmit timing generation block 70 is shown according to the present invention corresponding to the previous prior art transmit timing generation block 20 shown in FIG. 2. Timing generation block 70 processes a base frequency clock signal 22 and generates a modulated high frequency clock signal 73 as a timing signal for transmitting serial data suitable for downstream jitter testing.

Figure 1:
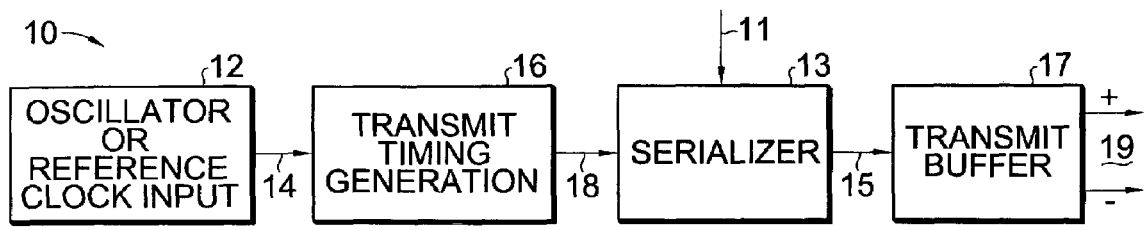
FIG. 1 is a block diagram of a prior art serial transmit path including an oscillator or reference clock input, a transmit timing generator, a serializer for receiving parallel data, and a transmit buffer having a differential output.

In the transmit timing generation block 70, the high frequency clock generator 24 increases the frequency of the base frequency clock signal to a higher fixed frequency value required by the serializer block 13 (shown in FIG. 1 but not shown in FIG. 7) to convert the parallel data to serial transmit data at the desired data rate. The modified clock modulator 78 can be implemented with variable delays (i.e. a variable delay generator). The modification to the clock modulator 78, over that of the prior art, can include increases in the range and increment resolution of delays as well as a faster update rate such that the higher frequencies of modulation, over that of the 30 KHz SSC modulation, can be generated as is explained in further detail below with respect to the jitter modulation command.

The variable delays shift the position of the clock edges in time as a function of the delay command value. As the delay command increases for each edge of the clock, the effect is that the clock frequency is reduced. If the delay is decreasing for each clock edge, the effect is that the clock frequency increases. Typically, the variable delay has a nominal value of delay that can be increased or decreased to produce the frequency increases and decreases.

The update rate of the delay command determines the maximum frequency and amplitude of the modulation as well as the quality of the modulation waveform.

As an example of the requirements of the modified clock modulator of the present invention over that of one designed for SSC (spread spectrum clocking) consider the case of an SATA transmitter. At Generation 1 data rates (1.5 GB/s), a date edge can be output every 666.67 ps. An SSC modulation of 0% to −0.5%, at a modulation rate of 30 KHz, changes the data edge spacing from 666.67 ps to 670.02 ps over the time of a half period of modulation. (16.67 us) During the half period of modulation (a triangle wave shape is assumed) 25,000 data edge times occur. Therefore the clock modulator must be able to change 670.02−666.67=3.35 ps over the time of 25,000 data edge times. Typically this change is distributed over this half period such that the delay is changed in a ramp like manner.

In contrast, the modified clock modulator of the present invention, must be able to change the data edge times at a much greater rate and over a wider range. For an example, a jitter compliance testing point for SATA Generation 1 requires a receiver to tolerate a total peak-to-peak jitter of 413 ps over the time of a half period of 3 MHz modulation. (166.67 ns) During the half period of modulation 250 data edge times occur. It can be seen that the update rate and range of delay is much greater than the 3.35 ps applied over the time of 25,000 data edges as with a clock modulator designed for the SSC modulation. The modified clock modulator of the present invention must have the capability to change the delay command at a faster rate (update rate) and be able to provide more delay change (range) over that of the prior art SSC modulator.

As another example, another jitter compliance testing point for SATA Generation 1 requires a receiver to tolerate a total peak to peak jitter of 303 ps over the time of a half period of 750 MHz modulation. (666.67 ps) This is the time of one data edge period. In this case, the modulation delays every other data edge time by 303 ps. It can be seen that the update rate and range of delay is much greater than the 3.35 ps applied over the time of 25,000 data edges as with a clock modulator designed for SSC modulation. The modified clock modulator of the present invention must have the capability to change the delay command at a faster rate (update rate) and be able to provide more delay change (range) over that of the prior art SSC modulator.

The command to the modified clock modulator 78 is now the sum of two modulation command waveforms generated in the modulation command block 27 and the jitter modulation command block 77. Block 27 generates the SSC modulation waveform and block 77 generates the jitter injection waveform. The format of these waveforms can be either digital or analog depending on the implementation of the modified clock modulator 78. Either or both of these waveforms on corresponding output lines 25 and 27 can be enabled depending on whether the transmission mode (SSC or fixed BAUD rate) or the jitter injection test mode was desired. The normal data transmission has two modes. In one case the BAUD rate (or data edge timing) is at a fixed frequency. In the other case the SSC modulation is active thereby affecting a reduction of EMI (Electromagnetic Interference). The jitter tolerance testing of the receiver connected to this data stream needs to be done for both of these transmission modes. Therefore, there are four possible operating modes (normal and SSC, with and without jitter added).

The modulation command waveform from the SSC modulation command block 27 has the same function as the 30 KHz command that was used in the prior art and it is enabled if the SSC mode of data transmission is desired. The other path 75 to the summer 76 is the new jitter injection command waveform according to the present invention. The frequency and magnitude of the jitter injection command can be specified in test mode registers such that when this command is enabled, the desired jitter is applied to the modulated high frequency clock signal 73 by means of the modified clock modulator 78. This in turn adds the desired jitter to the serial transmit data by means of the serializer 13 (not shown in FIG. 7).

Although specific, fixed jitter modulation signal frequencies and magnitudes can be specified, it is desirable to be able to inject jitter at known sinusoidal frequencies and magnitudes that are completely variable and have a wide adjustment range. This versatile capability, however, is traded off with the complexity and capability of the transmit timing generation block 70. Providing adjustable amplitude at typical frequencies used for compliance testing would provide the necessary function while maintaining a reasonable level of complexity. For an example of typical values, in the case of the SATA interface, there are some specific frequencies and amplitudes that are intended to test the receiver jitter tolerance. These jitter frequencies and levels are some of the specified levels that the receiver must be tolerant of, to be compliant to the specification.

Examples of the receiver jitter tolerance levels required for the receiver to be compliant to the SATA specification are provided, wherein "GEN1" refers to a Generation 1 serial data rate of 1.5 Gb/s, "GEN2" refers to a Generation 2 serial data rate of 3.0 Gb/s, "SATA" refers to Serial Advanced Technology Attachment, "TJ" refers to the total jitter, "DJ" refers to deterministic jitter, "UI" refers to the number of unit intervals or the number of edge times that occur during one half of the modulation period, and "ps pp" refers to picoseconds peak-to-peak.

SATA GEN1 Receiver Jitter Tolerance Requirements (calculated from spec):

| UI | Sine Freq. (MHz) | TJ Magnitude (ps pp) | DJ Magnitude (ps pp) |
|---|---|---|---|
| 1 | 750 | 303 (0.455 UI) | 183 (0.275 UI) |
| 5 | 150 | 303 (0.455 UI) | 183 (0.275 UI) |
| 6 | 125 | 413 (0.62 UI) | 247 (0.37 UI) |
| 250 | 3 | 413 (0.62 UI) | 247 (0.37 UI) |

SATA GEN2 Receiver Jitter Tolerance Requirements (calculated from spec):

| UI | Sine Freq. (MHz) | TJ Magnitude (ps pp) | DJ Magnitude (ps pp) |
|---|---|---|---|
| 1 | 1500 | 152 (0.455 UI) | 92 (0.275 UI) |
| 5 | 300 | 152 (0.455 UI) | 92 (0.275 UI) |
| 6 | 250 | 207 (0.62 UI) | 123 (0.37 UI) |
| 250 | 6 | 207 (0.62 UI) | 123 (0.37 UI) |

The magnitudes and frequencies above are some compliance levels for the receiver jitter tolerance testing. Adjustment around these values compensates for the base line jitter of the transmitter system and transmission channel including cabling, connectors, and the like. Also, since the total jitter is shown above, which includes the inherent jitter of the serial data transmit path, during testing this injected jitter level would be reduced to a lower value in order to check the receiver to the levels specified for jitter. To summarize, it is desirable to adjust the magnitude and frequency of the jitter and these numbers are provided as just a possible choice of settings.

Referring again to FIG. 7, a transmit timing generator 70 is shown for use in a transmit data path including a high frequency clock generator 24 having an input for receiving an oscillator or reference clock input 22, and an output 26. A clock modulator 78 has a first input 26 coupled to the output of the high frequency clock generator 24, a second input 74, and an output 73 for providing a high frequency modulated clock signal. A modulation command block 27 is used for providing a low frequency modulation signal 25. A jitter modulation command block 77 is used for providing a high frequency modulation signal. A summer 76 having first and second inputs 25, 75 for receiving the low and high frequency modulations signals, and an output 74 coupled to the second input of the clock modulator 78.

Figure 8:
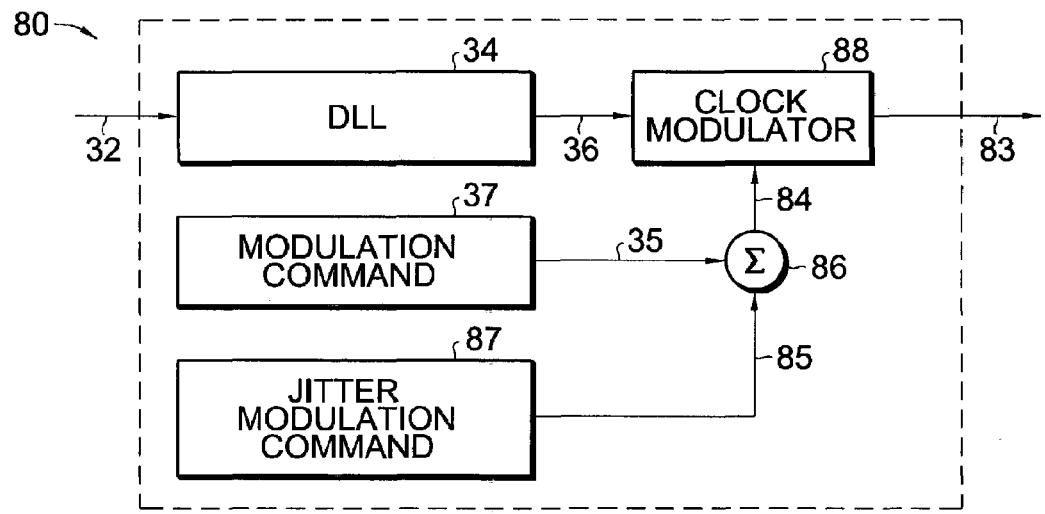

Referring now to FIG. 8, a transmit timing generator 80 for use in a transmit data path includes a delay-locked loop 34 having an input 32 for receiving an oscillator or reference clock input, and an output 36. A clock modulator 88 has a first input 36 coupled to the output of the delay-locked loop, a second input 84, and an output 83 for providing a high frequency modulated clock signal. A modulation command block 37 is used for providing a low frequency modulation signal. A jitter modulation command block 87 is used for providing a high frequency modulation signal. A summer 86 has first and second inputs 35, 85 for receiving the low and high frequency modulation signals, and an output 84 coupled to the second input of the clock modulator 88.

Figure 9:
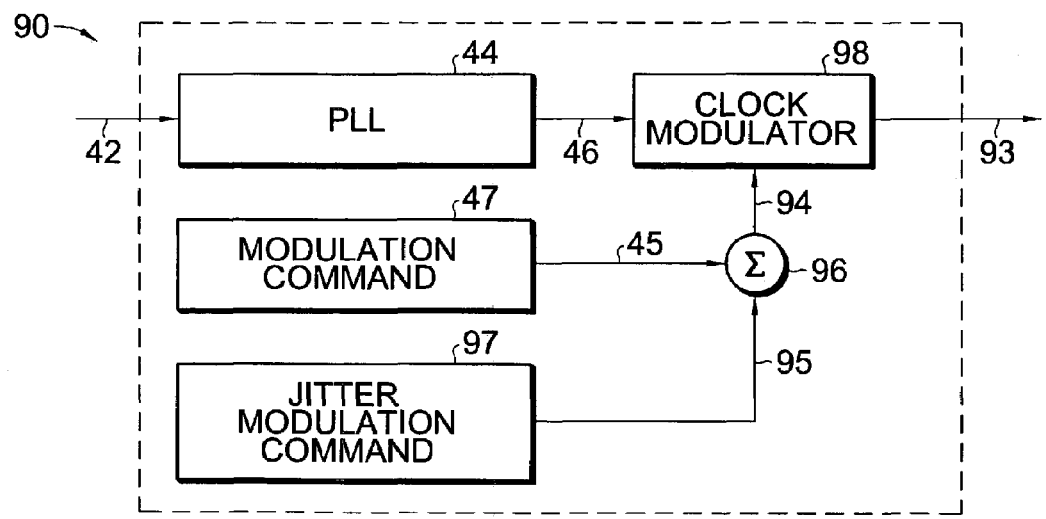

Referring now to FIG. 9, a transmit timing generator 90 for use in a transmit data path includes a phase-locked loop 44 having an input 42 for receiving an oscillator or reference clock input, and an output 46, a clock modulator 98 has a first input 46 coupled to the output of the phase-locked loop, a second input 94, and an output 93 for providing a high frequency modulated clock signal. A modulation command block 47 is used for providing a low frequency modulation signal 45. A jitter modulation command block 97 is used for providing a high frequency modulation signal 95. A summer 96 has first and second inputs 45, 95 for receiving the low and high frequency modulations signals, and an output 94 coupled to the second input of the clock modulator 98.

Figure 10:
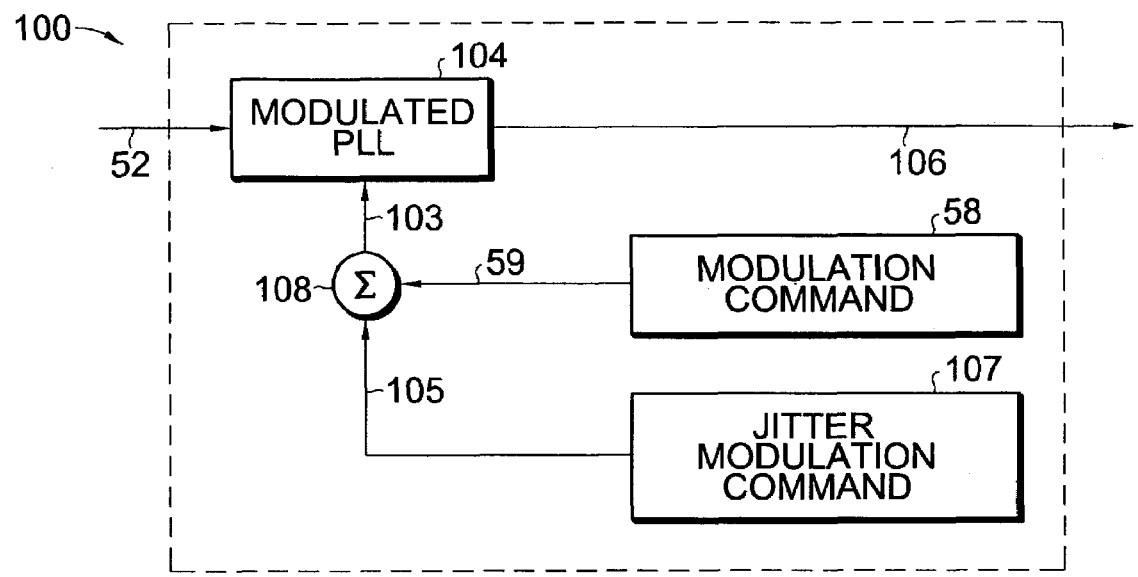

Referring now to FIG. 10, a transmit timing generator 100 for use in a transmit data path includes a modulated phase-locked loop 104 having a first input 52 for receiving an oscillator or reference clock input signal 52, a second input 103, and an output 106 for providing a high frequency modulated clock signal. A modulation command block 58 is used for providing a low frequency modulation signal. A jitter modulation command block 107 is used for providing a high frequency modulation signal. A summer 108 has first and second inputs 59, 105 for receiving the low and high frequency modulation signals, and an output 103 coupled to the second input of the modulated phase-locked loop 104.

Figure 11:
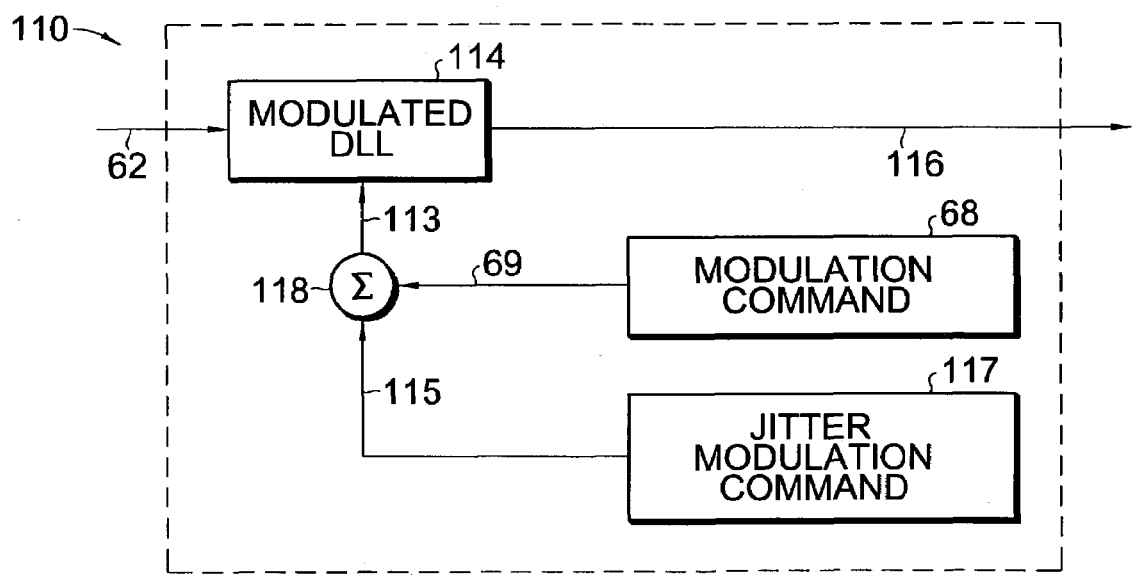

Referring now to FIG. 11, a transmit timing generator 110 for use in a transmit data path includes a modulated delay-locked loop 114 having a first input 62 for receiving an oscillator or reference clock input signal, a second input 113, and an output 116 for providing a high frequency modulated clock signal. A modulation command block 68 is used for providing a low frequency modulation signal. A jitter modulation command block 117 is used for providing a high frequency modulation signal. A summer 118 has first and second inputs 69, 115 for receiving the low and high frequency modulation signals, and an output 113 coupled to the second input of the modulated delay-locked loop 114.

While various embodiments of the transmit timing generator modified according to the present invention have been shown in FIGS. 7–11, it will be apparent to those skilled in the art that still further embodiments are possible to provide a modulated clock signal suitable for jitter testing as described. In operation, a modulated clock signal is provided in a data transmit path that is selectively modulated at a first low frequency (e.g. 30 KHz) in a first operating mode, and is selectively modulated at a second much high frequency (e.g. 3–1500 MHz) in a second operating mode for jitter testing.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

I claim:

1. A transmit timing generator for use in a transmit data path comprising:
   a high frequency clock generator having an input for receiving an oscillator or reference clock input signal, and an output;
   a clock modulator having a first input coupled to the output of the clock generator, a second input, and an output for providing a high frequency modulated clock signal;
   a modulation command block for providing a low frequency modulation signal;
   a jitter modulation command block for providing a high frequency modulation signal; and
   a summer having first and second inputs for receiving the low and high frequency modulations signals, and an output coupled to the second input of the clock modulator.

2. A transmit timing generator as in claim 1 in which the low frequency modulation signal is about 30 KHz.

3. A transmit timing generator as in claim 1 in which the high frequency modulation signal is about 3 MHz or 6 MHz.

4. A transmit timing generator as in claim 1 in which the high frequency modulation signal is about 125 or 250 MHz.

5. A transmit timing generator as in claim 1 in which the high frequency modulation signal is about 150 or 300 MHz.

6. A transmit timing generator as in claim 1 in which the high frequency modulation signal is about 750 or 1500 MHz.

7. A transmit timing generator for use in a transmit data path comprising:
   a delay-locked loop having an input for receiving an oscillator or reference clock input signal, and an output;
   a clock modulator having a first input coupled to the output of the delay-locked loop, a second input, and an output for providing a high frequency modulated clock signal;
   a modulation command block for providing a low frequency modulation signal;
   a jitter modulation command block for providing a high frequency modulation signal; and
   a summer having first and second inputs for receiving the low and high frequency modulations signals, and an output coupled to the second input of the clock modulator.

8. A transmit timing generator as in claim 7 in which the low frequency modulation signal is about 30 KHz.

9. A transmit timing generator as in claim 7 in which the high frequency modulation signal is about 3 MHz or 6 MHz.

10. A transmit timing generator as in claim 7 in which the high frequency modulation signal is about 125 or 250 MHz.

11. A transmit timing generator as in claim 7 in which the high frequency modulation signal is about 150 or 300 MHz.

12. A transmit timing generator as in claim 7 in which the high frequency modulation signal is about 750 or 1500 MHz.

13. A transmit timing generator for use in a transmit data path comprising:
    a phase-locked loop having an input for receiving an oscillator or reference clock input signal, and an output;
    a clock modulator having a first input coupled to the output of the phase-locked loop, a second input, and an output for providing a high frequency modulated clock signal;
    a modulation command block for providing a low frequency modulation signal;
    a jitter modulation command block for providing a high frequency modulation signal; and
    a summer having first and second inputs for receiving the low and high frequency modulations signals, and an output coupled to the second input of the clock modulator.

14. A transmit timing generator as in claim 13 in which the low frequency modulation signal is about 30 KHz.

15. A transmit timing generator as in claim 13 in which the high frequency modulation signal is about 3 MHz or 6 MHz.

16. A transmit timing generator as in claim 13 in which the high frequency modulation signal is about 125 or 250 MHz.

17. A transmit timing generator as in claim 13 in which the high frequency modulation signal is about 150 or 300 MHz.

18. A transmit timing generator as in claim 13 in which the high frequency modulation signal is about 750 or 1500 MHz.

19. A transmit timing generator for use in a transmit data path comprising:
    a modulated phase-locked loop having a first input for receiving an oscillator or reference clock input signal, a second input, and an output for providing a high frequency modulated clock signal;
    a modulation command block for providing a low frequency modulation signal;
    a jitter modulation command block for providing a high frequency modulation signal; and
    a summer having first and second inputs for receiving the low and high frequency modulation signals, and an output coupled to the second input of the modulated phase-locked loop.

20. A transmit timing generator as in claim 19 in which the low frequency modulation signal is about 30 KHz.

21. A transmit timing generator as in claim 19 in which the high frequency modulation signal is about 3 MHz or 6 MHz.

22. A transmit timing generator as in claim 19 in which the high frequency modulation signal is about 125 or 250 MHz.

23. A transmit timing generator as in claim 19 in which the high frequency modulation signal is about 150 or 300 MHz.

24. A transmit timing generator as in claim 19 in which the high frequency modulation signal is about 750 or 1500 MHz.

25. A transmit timing generator for use in a transmit data path comprising:
- a modulated delay-locked loop having a first input for receiving an oscillator or reference clock input signal, a second input, and an output for providing a high frequency modulated clock signal;
- a modulation command block for providing a low frequency modulation signal;
- a jitter modulation command block for providing a high frequency modulation signal; and
- a summer having first and second inputs for receiving the low and high frequency modulation signals, and an output coupled to the second input of the modulated delay-locked loop.

26. A transmit timing generator as in claim 25 in which the low frequency modulation signal is about 30 KHz.

27. A transmit timing generator as in claim 25 in which the high frequency modulation signal is about 3 MHz or 6 MHz.

28. A transmit timing generator as in claim 25 in which the high frequency modulation signal is about 125 or 250 MHz.

29. A transmit timing generator as in claim 25 in which the high frequency modulation signal is about 150 or 300 MHz.

30. A transmit timing generator as in claim 25 in which the high frequency modulation signal is about 750 or 1500 MHz.

31. A method of operating a data transmit path comprising:
- selectively providing a modulated clock signal at a low frequency in a first normal operating mode; and
- selectively providing a modulated clock signal at a higher frequency in a second operating mode for jitter testing.

32. The method of claim 31 in which the clock signal is modulated at a rate of about 30 KHz in the first operating mode.

33. The method of claim 31 in which the clock signal is modulated at a rate of about 3 to 1500 MHz in the second operating mode.

* * * * *